United States Patent
Hamada et al.

(10) Patent No.: US 10,804,121 B2
(45) Date of Patent: *Oct. 13, 2020

(54) SUBSTRATE TREATMENT APPARATUS, SUBSTRATE TREATMENT METHOD, AND METHOD FOR MANUFACTURING SUBSTRATE

(71) Applicant: SHIBAURA MECHATRONICS CORPORATION, Yokohama-shi, Kanagawa (JP)

(72) Inventors: Koichi Hamada, Yokohama (JP); Nobuo Kobayashi, Yokohama (JP)

(73) Assignee: SHIBAURA MECHATRONICS CORPORATION, Yokohama-Shi, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/441,709

(22) Filed: Feb. 24, 2017

(65) Prior Publication Data
US 2017/0250097 A1 Aug. 31, 2017

(30) Foreign Application Priority Data

Feb. 25, 2016 (JP) .................................. 2016-034659
Jan. 24, 2017 (JP) .................................. 2017-009913

(51) Int. Cl.
*H01L 21/67* (2006.01)
*H01L 21/687* (2006.01)
*H01L 21/306* (2006.01)
*G02F 1/13* (2006.01)

(52) U.S. Cl.
CPC ...... *H01L 21/67075* (2013.01); *G02F 1/1303* (2013.01); *H01L 21/30604* (2013.01); *H01L 21/6708* (2013.01); *H01L 21/67051* (2013.01); *H01L 21/67253* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 8,361,234 | B2* | 1/2013 | Izuta | H01L 21/67051 118/715 |
| 8,696,863 | B2* | 4/2014 | Higashijima | H01L 21/67034 156/345.21 |
| 8,864,937 | B2* | 10/2014 | Ohashi | H01L 21/67034 156/345.54 |
| 10,026,760 | B2* | 7/2018 | Hamada | B08B 3/00 |

(Continued)

FOREIGN PATENT DOCUMENTS

JP 09-134872 A 5/1997

*Primary Examiner* — Sylvia Macarthur
(74) *Attorney, Agent, or Firm* — Volpe and Koenig, P.C.

(57) ABSTRACT

According to an embodiment, a substrate treatment apparatus includes, a substrate support unit supporting a substrate, a rotary unit rotating the substrate, a treatment liquid supply unit supplying treatment liquid to a surface of the substrate, and a controller performing liquid discharge treatment to change liquid discharge velocity at which the treatment liquid is discharged from the substrate, at preset predetermined timing, during substrate treatment in which the treatment liquid is supplied while the substrate is rotated, with the treatment continued.

12 Claims, 5 Drawing Sheets

(56) References Cited

U.S. PATENT DOCUMENTS

| | | | | |
|---|---|---|---|---|
| 2013/0156948 A1* | 6/2013 | Amano | ............ | H01L 21/67051 |
| | | | | 427/240 |
| 2013/0224956 A1* | 8/2013 | Negoro | ............ | H01L 21/31111 |
| | | | | 438/697 |
| 2013/0260570 A1* | 10/2013 | Masuhara | ......... | H01L 21/30604 |
| | | | | 438/747 |
| 2013/0260574 A1 | 10/2013 | Masuhara et al. | | |
| 2014/0090669 A1* | 4/2014 | Hinode | ................ | B08B 7/0071 |
| | | | | 134/19 |
| 2015/0090694 A1* | 4/2015 | Hashimoto | ....... | H01L 21/67051 |
| | | | | 216/83 |
| 2015/0162224 A1* | 6/2015 | Hinode | ............... | H01L 29/6653 |
| | | | | 438/751 |
| 2015/0258553 A1* | 9/2015 | Kobayashi | ........ | H01L 21/67028 |
| | | | | 427/372.2 |
| 2016/0025409 A1* | 1/2016 | Miyazaki | .................. | F26B 3/28 |
| | | | | 34/274 |
| 2016/0276379 A1* | 9/2016 | Hamada | ............ | H01L 21/67115 |
| 2017/0095842 A1* | 4/2017 | Tanaka | ...................... | B08B 3/10 |
| 2017/0250097 A1* | 8/2017 | Hamada | ............ | H01L 21/67075 |

\* cited by examiner

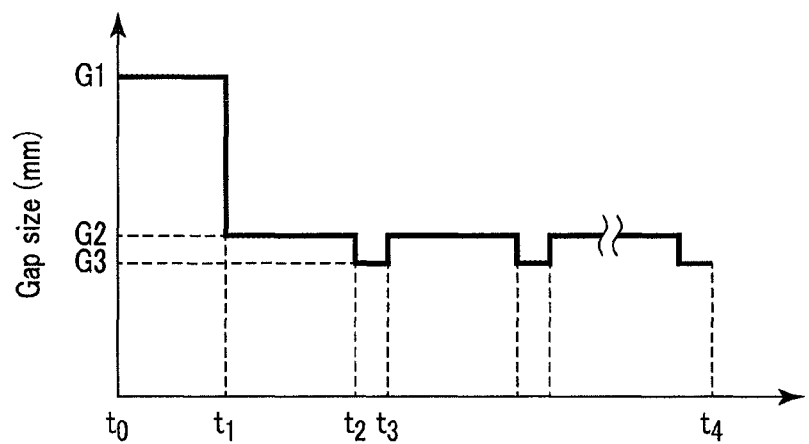
F I G. 5
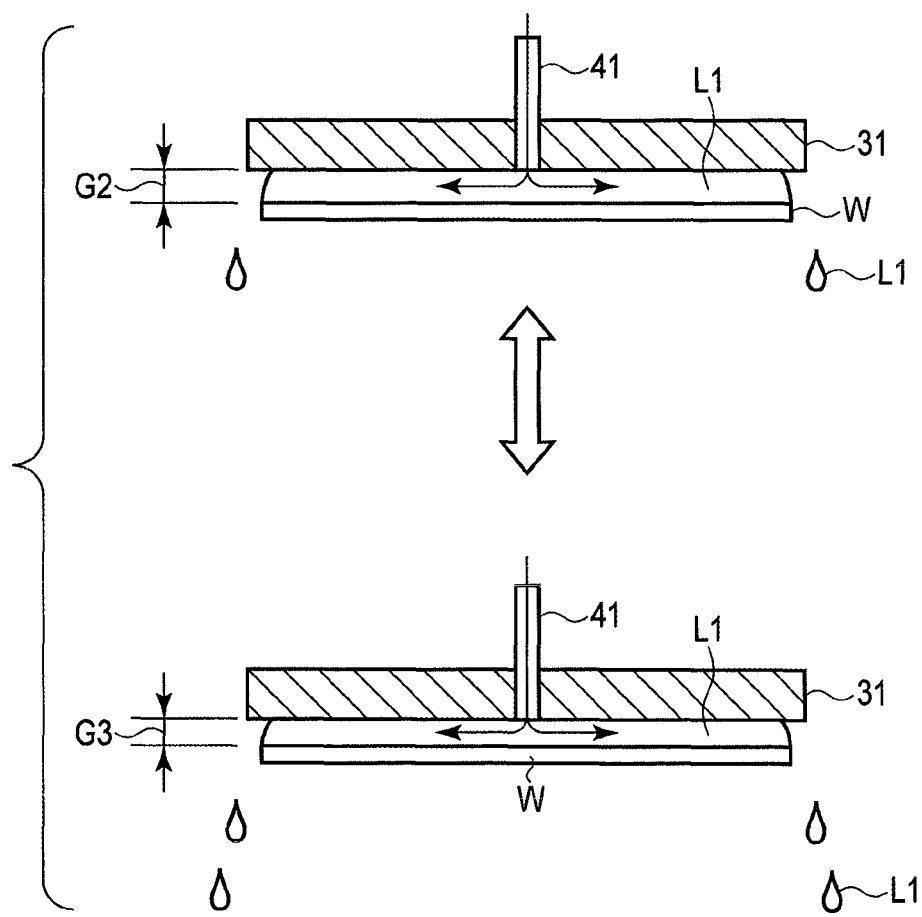
F I G. 6

US 10,804,121 B2

SUBSTRATE TREATMENT APPARATUS, SUBSTRATE TREATMENT METHOD, AND METHOD FOR MANUFACTURING SUBSTRATE

CROSS-REFERENCE TO RELATED APPLICATION

This application is based upon and claims the benefit of priority from the prior Japanese Patent Application No. 2016-034659, filed Feb. 25, 2016 and No. 2017-009913, filed Jan. 24, 2017 the entire contents of them are incorporated herein by reference.

FIELD

Embodiments described herein relate generally to a substrate treatment apparatus, a substrate treatment method, and a method for manufacturing a substrate.

BACKGROUND

In a manufacturing process of a semiconductor and a liquid crystal panel or the like, a substrate treatment apparatus is used. The substrate treatment apparatus supplies a treatment liquid onto a surface of a substrate, such as a wafer and a liquid crystal substrate, to treat the surface of the substrate (for example, see Japanese Patent Application Laid-Open Publication No. 9-134872). For example, as the treatment liquid, a resist stripping liquid or a cleaning liquid is supplied, to perform etching or cleaning. As such substrate treatment, a spin substrate treatment is known. In the spin substrate treatment, substrate is rotated, a treatment liquid is supplied from a nozzle opposed to the substrate surface onto the substrate surface, and the treatment liquid is spread on the substrate surface by centrifugal force of rotation. In such substrate treatment, the treatment liquid supplied onto the substrate is discharged at velocity corresponding to the treatment conditions, and new treatment liquid is successively supplied. Generally, various treatment conditions relating to rotation of the substrate and supply of the treatment liquid are set to conditions securing uniformity of substrate treatment.

In such spin substrate treatment, under certain treatment conditions, the treatment liquid is stagnant on the substrate for a long time, and thereby a sediment may occur in the treatment liquid, such as particles depositing in the treatment liquid on the substrate. Sediment occurring in the treatment liquid causes deterioration in treatment performance, such as the etching rate, the resist removal property, and the cleaning ability. For this reason, there is a demand for a substrate treatment apparatus, a substrate treatment method, and a method for manufacturing a substrate securing high treatment performance.

SUMMARY

According to an embodiment, a substrate treatment apparatus comprises, a substrate support unit supporting a substrate, a rotary unit rotating the substrate, treatment liquid supply unit supplying treatment liquid to a surface of the substrate, and a controller performing liquid discharge treatment to change liquid discharge velocity at which the treatment liquid is discharged from the substrate, at preset predetermined timing, during substrate treatment in which the treatment liquid is supplied while the substrate is rotated, with the treatment continued.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 5 is a graph illustrating a sequence of a position of a heater according to a second embodiment of the present invention;

FIG. 6 is an explanatory drawing illustrating change in position of the heater according to the second embodiment.

DETAILED DESCRIPTION

First Embodiment

Figure 1:
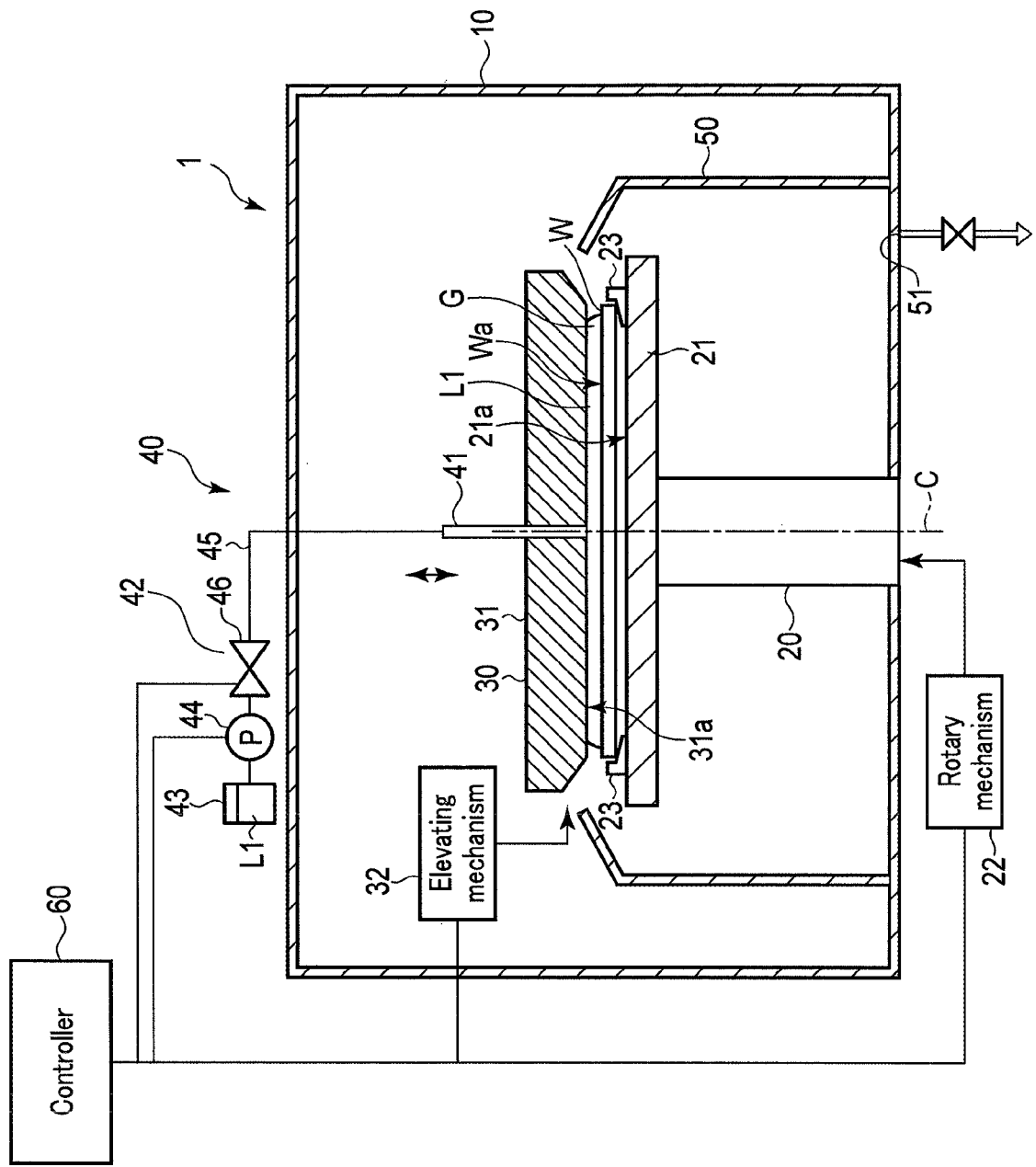
FIG. 1 is an explanatory drawing illustrating a structure of a substrate treatment apparatus according to a first embodiment of the present invention.
Figure 2:
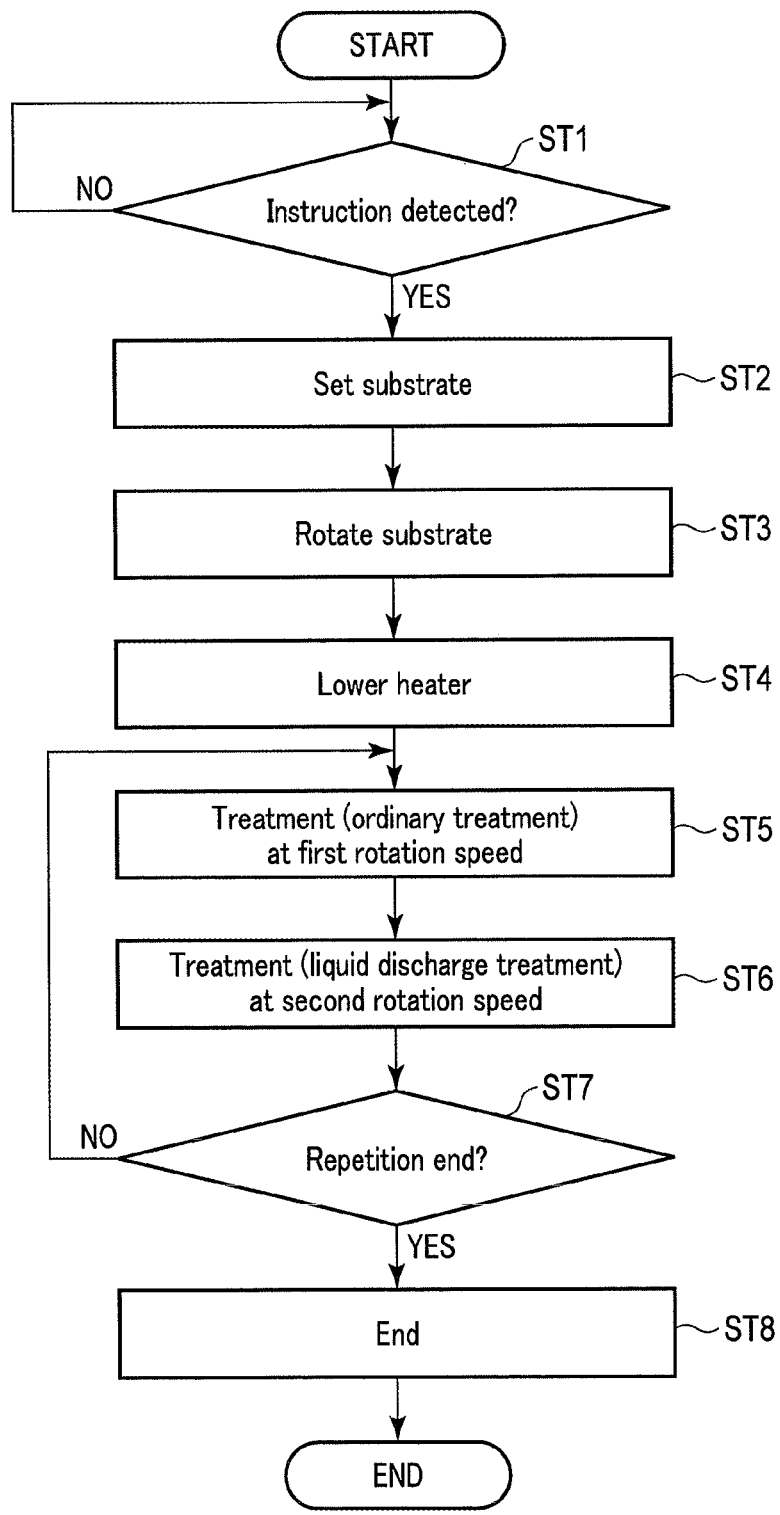
FIG. 2 is a flowchart of substrate treatment in the substrate treatment apparatus.
Figure 3:
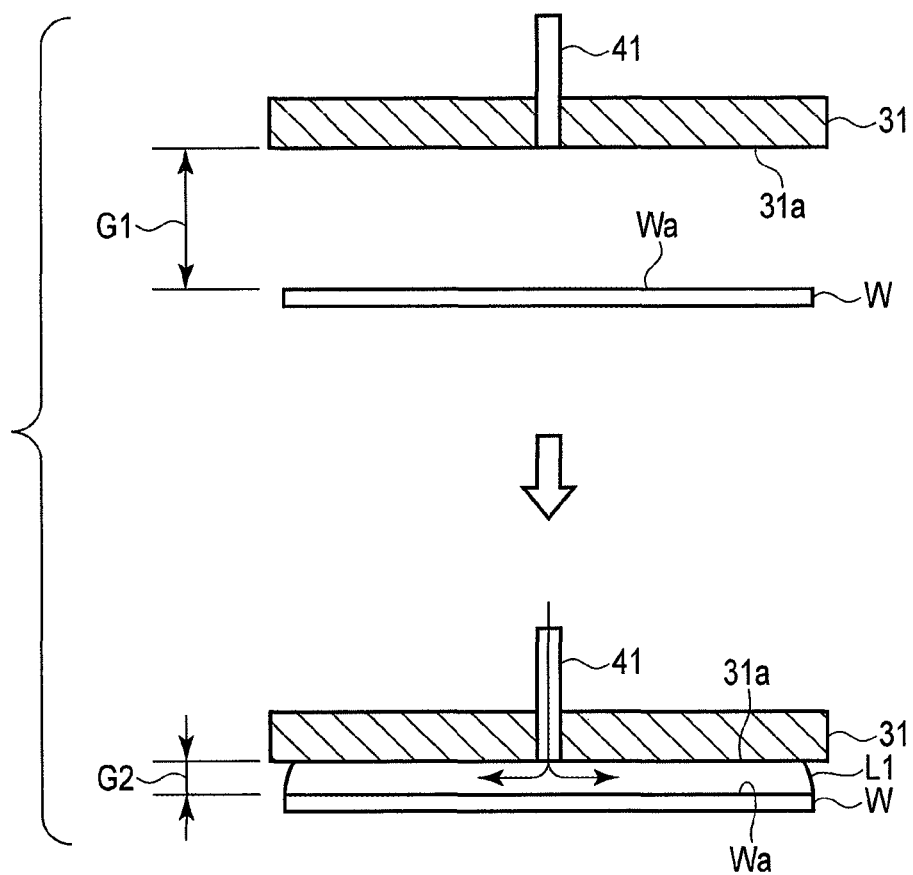
FIG. 3 is an explanatory drawing illustrating change in position of a heater according to the substrate treatment apparatus.
Figure 4:
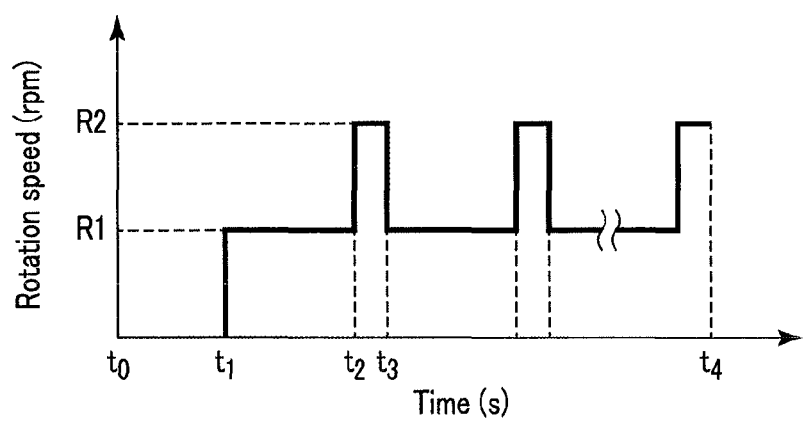
FIG. 4 is a graph illustrating a sequence of rotation speed in the substrate treatment apparatus.

A substrate treatment apparatus and a substrate treatment method according to a first embodiment of the present invention will be described hereinafter with reference to FIG. 1 to FIG. 3. FIG. 1 is an explanatory drawing illustrating a structure of a substrate treatment apparatus according to the first embodiment, and FIG. 2 is a processing flowchart in the substrate treatment apparatus. FIG. 3 is an explanatory drawing illustrating change in position of a heater, and FIG. 4 is a graph illustrating a sequence of rotation speed. For explanation, the structure is illustrated in an enlarged, reduced, or omitted state properly, in each of the drawings.

As illustrated in FIG. 1 and FIG. 2, the substrate treatment apparatus 1 includes a treatment chamber 10 forming a treatment room, a substrate support unit 20 rotatably supporting a substrate W, a heater 30 heating the substrate W and a treatment liquid L1, a treatment liquid supply unit 40 supplying the treatment liquid onto the substrate, a cup 50 receiving waste liquid, and a controller 60 controlling operations of the units.

The substrate support unit 20 includes a support table 21 supporting the substrate, and a rotary mechanism 22 serving as a rotary unit rotating the support table 21.

The support table 21 is provided in the treatment chamber 10, and includes a horizontal placing surface 21a on its upper surface. The peripheral edge of the placing surface 21a of the support table 21 is provided with a plurality of fixing portions 23 fixing the substrate detachably, for example. The substrate support unit 20 detachably support the substrate W, such as a wafer and a liquid crystal substrate, in a horizontal state on the placing surface 21a of the support table 21.

The rotary mechanism 22 is connected with the controller 60, and rotates and drives the support table 21 in a predetermined horizontal plane at desired rotation speed, under the control of the controller 60. Accordingly, the substrate support unit 20 is configured such that the rotation speed of the support table 21 is adjustable.

The heater 30 includes a heat plate 31, and an elevating mechanism 32 to elevate the heat plate 31. The heat plate 31 includes a heating surface 31a larger than a surface Wa of the substrate W. The heat plate 31 is supported by the elevating mechanism 31 such that the heating surface 31a is disposed to face the surface Wa of the substrate W. The heat plate 31 is connected with the controller 60, and configured such that the temperature thereof is adjustable. The area of the main surface of the heat plate 31 is larger than the area of the substrate W, and has a circular shape in plan view to cover the substrate W.

The elevating mechanism 32 is connected with the controller 60, vertically moves the heat plate 31 by the control of the controller 60, and stops the heat plate 31 at a predetermined position. Specifically, the heater 30 is configured such that the vertical position of the heat plate 31 is adjustable. Accordingly, the gap size G formed between the heating surface 31a and the surface Wa of the substrate W is configured to be adjustable. In the present embodiment, as illustrated in FIG. 3, the heat plate 31 can be moved to be positioned in, for example, a first position in which the gap size is G1, and a second position in which the gap size is G2 smaller than G1.

For example, the first position is a retreated position in which the surface Wa serving as the upper surface of the substrate W is separated from the heating surface 31a by a predetermined distance. The second position is a treatment position in which, for example, at least part of the space between the heating surface 31a and the surface Wa of the substrate W is filled with the treatment liquid L1, in other words, at least part of the treatment liquid L1 contacts the heating surface 31a.

The treatment liquid supply unit 40 includes a nozzle 41 disposed above the support table 21 to be opposed to the support table 21, and a supply mechanism 42 connected with the nozzle. The supply mechanism 42 includes, for example, a tank 43 storing the treatment liquid L1 to be sent to the nozzle 41, a pump 44 serving as a motive power source to pressure-feed the treatment liquid L1, a pipe forming a channel 45 connecting the tank 43 with the nozzle 41, and a shut-off valve 46 opening and closing the channel 45.

In the present embodiment, for example, a phosphoric acid aqueous solution, sulfuric acid, or a liquid chemical being a mixed solution thereof is used as the treatment liquid L1.

The nozzle 41 is disposed to run through the inside of the heat plate 31. For example, the distal end of the nozzle 41 is disposed in the central position of the heating surface 31a, and disposed to be opened above the central portion of the support table 21, and opposed thereto. For this reason, the nozzle 41 is configured to be elevatable together with movement of the heat plate 31.

The pump 44 and the shut-off valve 46 provided in the supply mechanism 42 are connected with the controller 60, to enable control of the operation of the supply mechanism 42. Accordingly, the treatment liquid supply unit 40 is configured such that the controller 60 is capable of controlling the supply timing and the supply quantity of the treatment liquid.

The cup 50 is formed in, for example, a cylindrical shape. The cup 50 is disposed to cover the periphery and the bottom of the substrate W, and receive waste liquid flowing down from the substrate W. The cup 50 is provided with a discharge pipe 51 discharging the accumulated waste liquid to the outside.

The controller 60 includes a processor controlling the various driving units of the substrate treatment apparatus 1, a memory storing various information, and a driving circuit driving each of the elements.

The controller 60 is connected with the rotary mechanism 22, the elevating mechanism 32, and the supply mechanism 42 of the substrate treatment apparatus 1. The processor controls operations of the respective units, to achieve various functions of the substrate treatment apparatus, based on various control programs and information such as operation conditions. The processor drives the rotary mechanism 22, the elevating mechanism 32, and the supply mechanism 42 such as the pump 44 and the shut-off valve 46, in accordance with the various operation conditions and the control programs.

Specifically, the processor executes control processing based on the control programs, and thereby the controller 60 including the processor as the central part controls the substrate rotation operation, the heater elevating operation, and the treatment liquid supply operation. Accordingly, the controller 60 functions as a rotation speed regulating unit regulating the rotation speed, a gap adjustment unit adjusting the gap, and a liquid quantity regulating unit regulating the supply quantity of the treatment liquid. In the present embodiment, the controller 60 functions as a liquid discharge unit executing liquid discharge treatment to increase the liquid discharge velocity serving as the flow velocity of the treatment liquid L1 at the time when the treatment liquid L1 is discharged from the surface of the substrate W, by regulating the rotation speed. The substrate treatment in the present invention includes ordinary treatment executing treatment to obtain uniformity of the treatment rate in the central portion and the peripheral portion of the substrate W, and the liquid discharge treatment. The liquid discharge treatment in the present invention indicates treatment in which the liquid discharge velocity is increased to be higher than that in the ordinary treatment with the substrate treatment continued, during the substrate treatment.

The following is explanation of the substrate treatment method and the method for manufacturing a substrate according to the present embodiment, with reference to FIG. 1 to FIG. 4. The following explanation illustrates etching in which a phosphoric acid aqueous solution serving as the treatment liquid L1 is supplied to a nitride film formed on the substrate W to perform treatment, as an example of the substrate treatment method and the method for manufacturing a substrate. In addition, suppose that the depositing particles are silica. The substrate treatment in the present invention indicates liquid chemical cleaning treatment in a series of treatments (liquid chemical cleaning, rinse treatment, and drying treatment) for the substrate W.

In a standby state, the heat plate 31 is retreated to the first position, and the heating surface 31a and the support table 21 are sufficiently separated from each other. For example, the gap size G1 in the standby state is set to 150 mm or more. In the standby state, rotation of the support table 21 is stopped.

First, when the controller 60 detects an instruction of substrate treatment (ST1), the controller 60 sets a substrate W serving as a treatment target (ST2). Specifically, the controller 60 carries the substrate W into the treatment chamber 10, and places the substrate W on the support table 21. Thereafter, the controller 60 drives the fixing portions 23 to fix the substrate W.

Thereafter, the controller 60 drives the rotary mechanism 22, to rotate the support table 21 at predetermined first rotation speed R1 (ST3). The first rotation speed R1 is rotation speed securing uniformity of the substrate treatment, and set to, for example, 300 rpm or less. In the present embodiment, R1 is 150 rpm.

The controller 60 drives the heater 30 to set the temperature of the heat plate 31 to predetermined temperature. The controller 60 also drives the elevating mechanism 32, to lower the heat plate 31 and set the heat plate 31 to the predetermined position (ST4). Specifically, the controller 60 lowers the heat plate 31 to the second position. The second position is, for example, a treatment position in which the gap size is G2. The gap size G2 is a size with which at least part of the gap G is filled with the treatment liquid L1 supplied to the substrate W. For example, in the present embodiment, the gap size G2 is set to 1.5 mm.

In addition, the controller 60 drives the supply mechanism 42, to supply the treatment liquid L1 from the nozzle 41 onto the substrate W with predetermined first flow rate Q1 (ST5). The first flow rate Q1 is a flow rate securing uniformity of treatment for the substrate W. For example, in the present embodiment, the first flow rate Q1 is set to 0.55 l/m.

In addition, the controller 60 executes liquid discharge treatment of increasing the flow velocity at the time when the treatment liquid L1 is discharged from the surface of the substrate W, that is, the liquid discharge velocity V, to promote liquid discharge while the substrate treatment is executed, during the substrate treatment (ST6). Specifically, after treatment at the first rotation speed R1, treatment is performed at second rotation speed R2, to execute liquid discharge treatment while the treatment is continued. Specifically, the controller 60 periodically increases the rotation speed to the second rotation speed R2, to increase the liquid discharge velocity V at which the treatment liquid L1 is discharged from the surface of the substrate W, using increase in centrifugal force. For example, the second rotation speed R2 is higher than the first rotation speed R1, and set to a range of 300 rpm to 600 rpm.

As illustrated in FIG. 4, the timing of liquid discharge treatment, for example, the timing at which liquid discharge treatment is started is set based on the time at which sediment occurs due to stagnation of the treatment liquid L1 in the time of substrate treatment, that is, the time at which deposition of particles occurs. For example, the liquid discharge treatment is executed for each certain time shorter than start of deposition of particles.

In addition, as illustrated in FIG. 4, the time for which liquid discharge treatment is performed at the second rotation speed R2 is set shorter than the time for which substrate treatment (ordinary treatment) is performed at the first rotation speed R1.

The particles are reaction products or a film to be treated depositing in the treatment liquid L1 staying on the substrate W, during the process of treating the substrate W. Reaction products and films to be treated are dissolved in the treatment liquid existing on the substrate W from the start of treatment. When the treatment time of the substrate W accumulates, more reaction products and films to be treated cannot be dissolved in the treatment liquid L1 existing on the substrate W, in which reaction products and films to be treated have already been dissolved, and the reaction products and the films to be treated deposit as particles. Examples of the particles include reaction products such as silica depositing in the treatment liquid L1 on the substrate W during etching with a phosphoric acid aqueous solution, and a residue of films to be treated such as resist depositing in the treatment liquid L1 on the substrate W during removal of the resist with sulfuric acid. When the treatment liquid L1 including these particles exists on the substrate W, the treatment liquid L1 may cause reduction in the reaction speed of the treatment liquid L1 for the film to be treated on the substrate W, reduction in the treatment rate of etching for the substrate W, and deterioration in resist removal performance.

In the present embodiment, liquid discharge treatment for five seconds is performed one by one every 30 seconds. The steps of ST5 to ST6 described above are repeated until the substrate treatment is finished (ST7). Specifically, the substrate W is subjected to substrate treatment with the treatment liquid L1 of the same type until the substrate treatment is finished, and the liquid discharge treatment is performed at the preset timing during the substrate treatment. When a preset time has passed from the start of the treatment, the controller 60 stops supply of the treatment liquid L1, and ends the substrate treatment (ST8). Thereafter, rinse treatment is executed properly.

The number of sets of repeating can be set in advance as treatment recipe, by dividing the scheduled treatment time A by the time T for a set of the substrate treatment (ordinary treatment) and the liquid discharge treatment, when the scheduled treatment time A is set in advance.

When N times of the time T for a set of the substrate treatment (ordinary treatment) in which treatment is performed at the first rotation speed T1 and the liquid discharge treatment in which treatment is performed at the second rotation speed R2 exceed the preset scheduled treatment time A, that is, when the remainder is generated by dividing the scheduled treatment time A by the time T, the time of the Nth set of the substrate treatment (ordinary treatment) is adjusted, and the time of the Nth set of the liquid discharge treatment is not changed. For example, each of the ordinary treatment and the liquid discharge treatment is repeated twice (two sets), and the time of the substrate treatment of the third set is set to five seconds, and the time of the liquid discharge treatment of the third set is set to five seconds. As described above, the time of each liquid discharge treatment performed a plurality of times is the same fixed time.

In the present embodiment, from the start of treatment (t1), the substrate treatment is performed for, for example, 25 seconds at the first rotation speed R1, as ordinary treatment. After treatment at the first rotation speed R1, the liquid discharge treatment is started (t2), the treatment is performed at the second rotation speed R2, and the liquid discharge treatment at the second rotation speed R2 is finished (t3) when five seconds has passed. The substrate treatment (ordinary treatment) and the liquid discharge treatment are regarded as a set, and a plurality of sets are repeated until the treatment is ended (t4). In repeating, after the liquid discharge treatment is ended, the rotation speed is reduced from the second rotation speed R2 to the first rotation speed R1, and substrate treatment (ordinary treatment) is performed again at the first rotation speed R1. In the present embodiment, the liquid discharge treatment is performed just before the end of the treatment, as illustrated in FIG. 4.

In the substrate treatment according to the present embodiment, the treatment liquid is continuously supplied. Specifically, the treatment liquid L1 is continuously supplied also during the liquid discharge treatment. This structure enables execution of the liquid discharge treatment with the substrate treatment continued.

With the substrate treatment apparatus, the substrate treatment method, and the method for manufacturing a substrate according to the present embodiment, the following effects are obtained. Specifically, the liquid discharge velocity at which the treatment liquid L1 moves from the substrate W can be increased, by changing the rotation speed in the middle of the substrate treatment, for example, by periodically increasing the rotation speed. This structure periodically promotes liquid discharge, and promotes replacement with new treatment liquid. This structure prevents deposition of particles in the treatment liquid L1 on the substrate W, for example, due to dissolution of reaction products of the film to be treated on the substrate W in the treatment liquid L1 with accumulation of the treatment time of the substrate W. Accordingly, this structure prevents reduction in the treatment rate due to deposition of particles, and prevents reduction in the treatment efficiency.

In addition, the time for which liquid discharge treatment is performed at the second rotation speed R2 is set shorter than the time for which substrate treatment (ordinary treatment) is performed at the first rotation speed R1. This structure enables periodical discharge of particles in the liquid discharge treatment at the second rotation speed, and treatment securing uniformity with the maintained treatment rate at the first rotation speed R1.

In the present embodiment, the rotary mechanism 22 for substrate treatment is controlled, to periodically increase the rotation speed and achieve liquid discharge treatment. This structure improves the treatment efficiency using the existing equipment, without introduction of a new mechanism.

In addition, the liquid discharge promotion treatment is performed just before the end of the substrate treatment. This structure promotes replacement of the treatment liquid, and effectively prevents reduction in treatment efficiency, even in the case where particles easily deposit, such as the case where the rinse treatment is performed in the subsequent step with cleaning water with temperature lower than that of the treatment liquid L1 and the temperature lowers.

Second Embodiment

The following is explanation of a substrate treatment apparatus, a substrate treatment method, and a method for manufacturing a substrate according to the second embodiment of the present invention, with reference to FIG. 5 and FIG. 6. FIG. 5 is a graph illustrating a sequence of the position of the heater according to the present embodiment, and FIG. 6 is an explanatory drawing illustrating change in position of the heater. In the present embodiment, although the processing to change the gap G between the substrate W and the heat plate 31 is performed as liquid discharge treatment, the other apparatus structures and the processes are the same as those of the first embodiment described above, and common explanation will be omitted.

In the present embodiment, the controller 60 drives the elevating mechanism 32 as the liquid discharge treatment during the substrate treatment, to periodically lower the heat plate 31 from a second position in which the heat plate 31 is positioned as the treatment position, and dispose the heat plate 31 in a third position. Specifically, the controller 60 disposes the heat plate 31 in the third position for five seconds every 30 seconds, to perform liquid discharge treatment.

Specifically, for example, as illustrated in FIG. 5, the controller 60 lowers the heat plate 31 from the initial first position, to dispose the heat plate 31 in the second position. Thereafter, the controller 60 supplies the treatment liquid to start treatment (t1). Thereafter, as ordinary treatment, substrate treatment is performed for 25 seconds (t2) in a state where the heat plate 31 is disposed in the second position, and thereafter the heat plate 31 is further lowered from the second position to the third position (t2). Then, liquid discharge treatment is performed for five seconds (t3) in the state where the heat plate 31 is disposed in the third position. The substrate treatment (ordinary treatment) and the liquid discharge treatment are regarded as a set, and a plurality of sets are repeated until the treatment is ended (t4). In repeating, after the liquid discharge treatment is finished, the heat plate 31 is lifted from the third position to the second position, and the treatment of the substrate W is performed in the state where the heat plate 31 is disposed again in the second position. Also in the present embodiment, liquid discharge treatment is performed just before the end of the substrate treatment (t4). In addition, as illustrated in FIG. 5, the time for which the heat plate 31 is disposed in the third position to perform liquid discharge treatment is set shorter than the time for which the heat plate 31 is disposed in the second position to perform substrate treatment.

In the substrate treatment according to the present embodiment, the treatment liquid is continuously supplied. Specifically, the treatment liquid L1 is continuously supplied also during the liquid discharge treatment. This structure enables execution of the liquid discharge treatment with the substrate treatment continued.

As illustrated in FIG. 6, the third position is a liquid discharge position in which the heating surface 31a abuts against at least part of the treatment liquid L1, a gap size G3 between the surface Wa of the substrate W and the heating surface 31a is smaller than G2, and discharge of the treatment liquid L1 from the surface of the substrate W is promoted. The gap size G3 is set to, for example, 1.2 mm.

The processor executes control processing based on the control programs, and thereby the controller 60 including the processor as the central part controls the substrate rotation operation, the heater elevating operation, and the treatment liquid supply operation. Accordingly, the controller 60 functions as a rotation speed regulating unit regulating the rotation speed, a gap adjustment unit adjusting the gap, and a liquid quantity regulating unit regulating the supply quantity of the treatment liquid. Specifically, in the present embodiment, the controller 60 functions as a liquid discharge unit executing liquid discharge treatment to increase the liquid discharge velocity by adjusting the gap.

The substrate treatment apparatus, the substrate treatment method, and the method for manufacturing a substrate according to the present embodiment obtain the same effects as those of the first embodiment described above. Specifically, during the substrate treatment, the gap G is periodically changed, for example, the gap G is periodically narrowed. This structure reduces the cross section of the channel, increases the liquid discharge velocity at which the treatment liquid moves from the substrate, and promotes liquid discharge. Accordingly, this structure prevents the treatment liquid on the substrate from being stagnant thereon, and promotes replacement with new treatment liquid. For this reason, this structure prevents reduction in treatment efficiency due to deposition of particles in the treatment liquid on the substrate. In addition, the time for which the heat plate 31 is disposed in the third position to perform liquid discharge treatment is set shorter than the time for which the heat plate 31 is disposed in the second position to perform substrate treatment (ordinary treatment). This structure enables periodical discharge of particles by liquid discharge treatment in the third position, and enables treatment securing uniformity with the maintained treatment rate in the second position.

In the present embodiment, because liquid discharge treatment is achieved using the elevating mechanism of the heater 30, the treatment efficiency can be improved using the existing equipment, without introduction of new equipment. In addition, the liquid discharge promotion treatment is performed just before the end of the substrate treatment. This structure promotes replacement of the treatment liquid, and effectively prevents reduction in treatment efficiency, even in the case where particles easily deposit, such as the case where the temperature decreases in the subsequent step.

Third Embodiment

Figure 7:
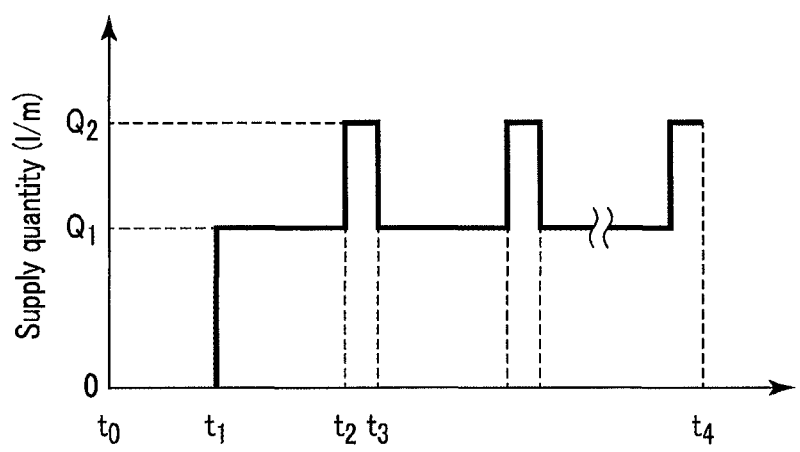
FIG. 7 is a graph illustrating a sequence of treatment liquid supply quantity according to a third embodiment of the present invention.

The following is explanation of a substrate treatment apparatus, a substrate treatment method, and a method for manufacturing a substrate according to the third embodiment of the present invention, with reference to FIG. 7. FIG. 7 is a graph illustrating a sequence of supply quantity of the treatment liquid according to the present embodiment. In the present embodiment, although the treatment to periodically increase the supply quantity of the treatment liquid is performed as liquid discharge treatment, the other apparatus structures and the processes are the same as those of the first embodiment described above, and common explanation will be omitted.

In the present embodiment, during the substrate treatment, the controller 60 controls the supply mechanism 42 as liquid discharge treatment, to periodically increase the supply quantity of the treatment liquid L1. Specifically, the treatment liquid L1 is supplied with predetermined flow rate Q1 from the start of substrate treatment, and the flow rate is periodically increased to Q2. For example, the liquid discharge treatment is performed once for five seconds every 30 seconds.

For example, as illustrated in FIG. 7, from the start of treatment (t1), substrate treatment (ordinary treatment) to supply the treatment liquid L1 with the first flow rate Q1 is performed for 25 seconds (t2), thereafter the flow rate is switched to the second flow rate Q2, and liquid discharge treatment to supply the treatment liquid L1 with the second flow rate Q2 is performed for five seconds (t3). The steps from t1 to t3 is regarded as a set, and a plurality of sets are repeatedly performed until the treatment of the substrate W is finished (t4). In repeating, after the liquid discharge treatment is finished, the flow rate is reduced from Q2 to Q1, and thereafter the treatment liquid L1 is supplied with the flow rate Q1 again, to perform treatment of the substrate W. Also in the present embodiment, liquid discharge treatment is performed just before the end of the substrate treatment. In addition, the time for which liquid discharge treatment to supply the treatment liquid L1 with the second flow rate Q2 is performed is set shorter than the time for which substrate treatment to supply the treatment liquid L1 with the first flow rate Q1 is performed. This structure enables periodical discharge of particles by the liquid discharge treatment to supply the treatment liquid L1 with the second flow rate Q2, and enables treatment securing uniformity with the maintained treatment rate by supplying the treatment liquid L1 with the first flow rate Q1.

The second flow rate Q2 is set to a desired flow rate larger than Q1 and enabling increase in liquid discharge velocity of the treatment liquid L1. For example, in the present embodiment, Q1 is set to 0.55 l/m, and Q2 is set to 0.65 l/m.

The processor executes control processing based on the control programs, and thereby the controller 60 including the processor as the central part controls the substrate rotation operation, the heater elevating operation, and the treatment liquid supply operation. Accordingly, the controller 60 functions as a rotation speed regulating unit regulating the rotation speed, a gap adjustment unit adjusting the gap, and a liquid quantity regulating unit regulating the supply quantity of the treatment liquid. Specifically, in the present embodiment, the controller 60 functions as a liquid discharge unit executing liquid discharge treatment to increase the liquid discharge velocity by liquid quantity regulation regulating the supply quantity of the treatment liquid.

The substrate treatment apparatus, the substrate treatment method, and the method for manufacturing a substrate according to the present embodiment obtain the same effects as those of the first embodiment described above. Specifically, during the substrate treatment, the flow rate of the treatment liquid L1 is periodically increased. This structure increases the liquid discharge velocity at which the treatment liquid L1 moves from the substrate W, and periodically promotes liquid discharge. Accordingly, this structure prevents the treatment liquid on the substrate from being stagnant thereon, and promotes replacement with new treatment liquid. For this reason, this structure prevents reduction in treatment efficiency due to deposition of particles in the treatment liquid on the substrate.

The time for which the substrate treatment (ordinary treatment) is performed to supply the treatment liquid L1 with the first flow rate Q2 is set shorter than the time for which the liquid discharge treatment is performed to supply the treatment liquid L1 with the second flow rate Q1.

In the present embodiment, because liquid discharge treatment is achieved using the supply mechanism for the treatment liquid, the treatment efficiency can be improved using the existing equipment, without introduction of new equipment. In addition, the liquid discharge promotion treatment is performed just before the end of the substrate treatment. This structure promotes replacement of the treatment liquid, and effectively prevents reduction in treatment efficiency, even in the case where particles easily deposit, such as the case where the temperature reduces in the subsequent step.

In the substrate treatment according to the present embodiment, the treatment liquid is continuously supplied. Specifically, the treatment liquid L1 is continuously supplied also during the liquid discharge treatment. This structure enables execution of the liquid discharge treatment with the substrate treatment continued.

The present invention is not limited to the above embodiments as they are, but the constituent elements may be modified to be materialized in carrying out the invention.

For example, the embodiments may be used in combination. Specifically, one or more of treatments of increasing the rotation speed at predetermined timing, increasing the flow rate of the treatment liquid, and reducing the gap between the substrate and the heater may properly be used in combination, to increase the liquid discharge velocity at which the treatment liquid moves from the surface of the substrate.

The embodiments described above illustrate the example in which the heat plate 31 is moved, but the structure is not limited thereto. For example, the structure may further include an elevating mechanism to elevate the support table 21, and the substrate may be elevated instead of elevation of the heater, or in addition to elevation of the heater, when the relative distance is adjusted. Besides, the heat plate 31 may be rotated, in addition to rotation of the support table 21.

As examples of the treatment liquid L1, the embodiments described above illustrate a phosphoric acid aqueous solution, sulfuric acid, or a liquid chemical being a mixed solution thereof, but the structure is not limited thereto. For example, pure water may be supplied instead of the liquid chemicals, to perform substrate treatment to clean the substrate. As another example, two tanks 43 may be connected to the nozzle 41. The tanks 43 may store liquid chemical and pure water, respectively, and the liquid to be supplied may be switched at predetermined timing. For example, the liquid chemical is continuously supplied to perform substrate treatment, and thereafter pure water may be supplied to perform cleaning.

Some embodiments of the present invention have been explained above, but these embodiments are presented as examples, and are not aimed at limiting the scope of the invention. These novel embodiments may be carried out in other various forms, and various omissions, substitutions, and changes may be performed within a range not departing from the gist of the invention. These embodiments and modifications thereof are included in the scope and the gist of the invention, and included in the inventions recited in the claims and their equivalents.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the inventions.

What is claimed is:

1. A substrate treatment apparatus comprising:
    a substrate support that includes a substrate support table that rotatably supports a substrate;
    a treatment liquid supply that supplies a treatment liquid to a surface of the substrate supported by the substrate support table;
    a heater including a heating surface disposed to face the surface of the substrate that is supported by the substrate support table, wherein the heater heats the substrate and the treatment liquid, wherein the heating surface is in direct contact with the treatment liquid supplied to the surface of the substrate;
    a lifter of the heater; and
    a controller that is communicatively coupled the substrate support, the treatment liquid supply, the lifter of the heater, and the heater, wherein the controller is configured to:
    control the treatment liquid supply to continuously supply the treatment liquid to the substrate while the substrate is rotating,
    at a predetermined timing, while the treatment liquid supply continuously supplies the treatment liquid to the substrate, control the lifter to move the heater between a second position in which the heating surface contacts the treatment liquid supplied to the surface of the substrate, and a third position that is closer to the substrate than the second position,
    control the lifter to locate the heater at the third position immediately before the treatment liquid supply is controlled to stop supplying the treatment liquid,
    wherein the second position is a position in which a distance between the substrate and the heating surface is smaller than that in a first position, the first position is a retreated position in which the heating surface and the substrate are separated from each other, and
    wherein the third position is a location in which a distance between the substrate and the heating surface is smaller than that in the first position and the second position.

2. The substrate treatment apparatus according to claim 1, wherein: the treatment liquid supply includes a nozzle, a tank connected with the nozzle via a channel and storing the treatment liquid, and a valve connected with the controller and opening and closing the channel under the control of the controller; and the nozzle is disposed on the heating surface of the heater and disposed to face the substrate support table.

3. A substrate treatment apparatus, comprising:
    a substrate support that includes a substrate support table that rotatably supports a substrate;
    a treatment liquid supply that supplies a treatment liquid to a surface of the substrate supported by the substrate support table;
    a heater including a heating surface disposed to face the surface of the substrate that is supported by the substrate support table, wherein the heater heats the substrate and the treatment liquid, wherein the heating surface is in direct contact with the treatment liquid supplied to the surface of the substrate;
    a lifter of the heater; and
    a controller that is communicatively coupled the substrate support, the treatment liquid supply, the lifter of the heater and the heater, wherein the controller is configured to:
    control the treatment liquid supply to continuously supply the treatment liquid to the substrate while the substrate is rotating,
    control the lifter to locate the heater at a treatment position where the heating surface is in contact with the treatment liquid supplied to the surface of the substrate, the treatment position is such that a distance between the substrate and the heating surface is smaller than in a retreated position in which the heating surface and the substrate are separated from each other,
    at a predetermined timing, while the lifter locates the heater at the treatment position and the treatment liquid supply continuously supplies the treatment liquid to the substrate, control the substrate support to change a rotation speed of the substrate rotated between a first rotation speed and a second rotation speed, wherein the first rotation speed is greater than zero and the second rotation speed is higher than the first rotation speed, and
    control the substrate support to set the rotation speed of the substrate to the second rotation speed immediately before the treatment liquid supply is controlled to stop supplying the treatment liquid.

4. The substrate treatment apparatus according to claim 3, wherein the controller changes the rotation speed between the first rotation speed and the second rotation speed while the liquid supply supplies the treatment liquid, the changing the rotation speed performed a plurality of times.

5. The substrate treatment apparatus according to claim 4, wherein time of each of the treatments of the substrate at the second rotation speed is same fixed time.

6. The substrate treatment apparatus according to claim 3, wherein time of one treatment of the substrate at the second rotation speed is shorter than time of one treatment of the substrate at the first rotation speed.

7. The substrate treatment apparatus according to claim 3, wherein: the treatment liquid supply includes a nozzle, a tank connected with the nozzle via a channel and storing the treatment liquid, and a valve connected with the controller and opening and closing the channel under the control of the controller; and the nozzle is disposed on the heating surface of the heater and disposed to face the substrate support table.

8. A substrate treatment apparatus, comprising:
a substrate support that includes a substrate support table that rotatably supports a substrate;
a treatment liquid supply that supplies a treatment liquid to a surface of the substrate supported by the substrate support table;
a heater including a heating surface disposed to face the surface of the substrate that is supported by the substrate support table, wherein the heater heats the substrate and the treatment liquid, wherein the heating surface is in direct contact with the treatment liquid supplied to the surface of the substrate;
a lifter of the heater; and
a controller that is communicatively coupled the substrate support, the treatment liquid supply, the lifter of the heater, and the heater, wherein the controller is configured to:
control the treatment liquid supply to continuously supply the treatment liquid while the substrate is rotating,
control the lifter to locate the heater at a treatment position where the heating surface is in contact with the treatment liquid supplied to the surface of the substrate, the treatment position is such that a distance between the substrate and the heating surface is smaller than in a retreated position in which the heating surface and the substrate are separated from each other,
at a predetermined timing, while the lifter locates the heater at the treatment position and the treatment liquid supply continuously supplies the treatment liquid to the substrate, control the treatment liquid supply to change a flow rate of the treatment liquid supplied by the treatment liquid supply between a first flow rate and a second flow rate, wherein the second flow rate is larger than the first flow rate, and
control the treatment liquid supply to set an amount of treatment liquid supplied to the second flow rate immediately before the treatment liquid supply is controlled to stop supplying the treatment liquid.

9. The substrate treatment apparatus according to claim 8, wherein the controller changes the flow rate between the first flow rate and the second flow rate during supply of the treatment liquid, the changing the flow rate performed a plurality of times.

10. The substrate treatment apparatus according to claim 9, wherein time of each of the treatments of the substrate at the second flow rate is same fixed time.

11. The substrate treatment apparatus according to claim 8, wherein time of one treatment of the substrate at the second flow rate is shorter than time of one treatment of the substrate at the first flow rate.

12. The substrate treatment apparatus according to claim 8, wherein: the treatment liquid supply includes a nozzle, a tank connected with the nozzle via a channel and storing the treatment liquid, and a valve connected with the controller and opening and closing the channel under the control of the controller; and the nozzle is disposed on the heating surface of the heater and disposed to face the substrate support table.

* * * * *